(12) United States Patent
Rostalski et al.

(10) Patent No.: US 7,492,509 B2
(45) Date of Patent: Feb. 17, 2009

(54) PROJECTION OPTICAL SYSTEM (75) Inventors: Hans-Juergen Rostalski, Oberkochen (DE); Aurelian Dodoc, Oberkochen (DE); Wilhelm Ulrich, Aalen (DE); Alexander Epple, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 180 days.

(21) Appl. No.: 10/581,651

(22) PCT Filed: Nov. 25, 2004

(86) PCT No.: PCT/EP2004/013519

§ 371 (c)(1),
(2), (4) Date: Feb. 17, 2007

(87) PCT Pub. No.: WO2005/054956

PCT Pub. Date: Jun. 16, 2005

(65) Prior Publication Data
US 2007/0258152 A1 Nov. 8, 2007

Related U.S. Application Data (60) Provisional application No. 60/526,096, filed on Dec. 2, 2003.

(51) Int. Cl.
*G02B 13/14* (2006.01)
(52) U.S. Cl. .................. 359/355; 359/649; 359/650; 359/656; 359/660; 359/682; 359/781
(58) Field of Classification Search .......... 359/649, 359/650, 656, 660, 682, 355, 781
See application file for complete search history.

(56) References Cited

U.S. PATENT DOCUMENTS 5,969,803 A   10/1999   Mercado (Continued)

FOREIGN PATENT DOCUMENTS

DE    199 55 984    5/2001

(Continued)

*Primary Examiner*—Evelyn A. Lester
(74) *Attorney, Agent, or Firm*—Jones Day

(57) ABSTRACT

A projection optical system comprises a plurality of lenses disposed along an optical axis of the projection optical system; wherein the plurality of lenses is dividable into four non-overlapping groups of lenses of positive and negative refractive powers, wherein the following relation is fulfilled:

$$2 \cdot y \cdot NA \cdot \frac{1}{k} \cdot \sum_{i=1}^{k} |\varphi_i| \geq V_1$$

wherein:
y is half a diameter in mm of a maximum image field imaged by the projection optical system,
NA is a maximum numerical aperture on a side of the second object,
$\varphi_i$ is a refractive power in $mm^{-1}$ of the $i^{th}$ lens,
k is a total number of lenses of the projection optical system, and wherein $V_1$ is greater than 0.045.

54 Claims, 3 Drawing Sheets

U.S. PATENT DOCUMENTS

| | | |
|---|---|---|
| 6,445,510 B1 | 9/2002 | Schuster et al. |
| 6,891,683 B2 * | 5/2005 | Schuster .................... 359/754 |
| 2002/0122164 A1 | 9/2002 | Schuster et al. |
| 2002/0186355 A1 | 12/2002 | Omura |
| 2003/0030916 A1 | 2/2003 | Suenaga |
| 2003/0147061 A1 | 8/2003 | Omura |
| 2004/0075894 A1 | 4/2004 | Shafer et al. |
| 2005/0190455 A1 * | 9/2005 | Rostalski et al. ............ 359/649 |
| 2005/0231813 A1 | 10/2005 | Rostalski et al. |
| 2007/0019301 A1 * | 1/2007 | Schuster .................... 359/649 |
| 2007/0109659 A1 * | 5/2007 | Rostalski et al. ............ 359/649 |
| 2007/0188880 A1 * | 8/2007 | Schuster .................... 359/649 |

FOREIGN PATENT DOCUMENTS

| | | |
|---|---|---|
| EP | 1 139 138 | 10/2001 |
| EP | 1 245 984 | 10/2002 |
| WO | WO 03/050587 | 6/2003 |
| WO | WO 03/075049 | 9/2003 |
| WO | WO 03/075096 | 12/2003 |
| WO | WO 2005/019878 | 3/2005 |
| WO | WO 2005/054956 | 10/2005 |

* cited by examiner

PROJECTION OPTICAL SYSTEM

BACKGROUND OF THE INVENTION

1. Field of the Invention

The present invention relates to a projection optical system, in particular, a projection optical system having a high numerical aperture.

2. Related Background Art

Lithographic processes are commonly used in the manufacture of semiconductor elements, such as integrated circuits (ICs), LSIS, liquid crystal elements, micropatterened members and micromechanical components.

A projection exposure apparatus used for photolithography generally comprises an illumination optical system with a light source and a projection optical system. Light from the illumination optical system illuminates a reticle (a first object) having a given pattern and the projection optical system transfers an image of the reticle pattern (the first object), onto a region of a photo-sensitive substrate (a second object). The image of the reticle pattern may also be reduced in size by the projection optical system so as to produce a smaller image of the reticle pattern on the substrate.

The trend to ever smaller and more sophisticated miniaturized devices places increasingly high demands on the projection exposure systems and thus projection optical systems used for the manufacture of these devices. In order to achieve better resolution in the exposure of substrates, projection optical systems with increased numerical apertures are being developed. In addition, a wavelength of light used for exposing substrates is decreased. Both of these changes bring about a whole range of new challenges in terms of a design of a projection optical system and a choice of lens materials.

At present, illumination light of wavelengths shorter than 200 nm is predominantly used in the recently developed projection exposure systems. High quality lens materials suitable for use in projection optical system having a high numerical aperture and at a short wavelength tend to be in short supply and are generally associated with high cost.

From the state of the art, projection optical systems with numerical apertures (on a substrate side of the projection optical system) up to 0.9 are known. Due to the need of correcting aberrations in the projection optical system, low angles of incidence and deflection of imaging beams (transferring an image of the first object onto the region of the second object) are generally preferred in such systems. This generally leads to projection optical systems comprising lenses of large diameter and a long distance between the first and the second object, or reticle and substrate, respectively. The large lens diameters and the long distance are, however, generally synonymous with a high mass of the lens material and thus high cost. As a consequence, the projection optical system tends to become rather heavy.

Following the present trend and developing projection optical systems using illumination light wavelengths of shorter than 200 nm and with even higher numerical apertures whilst using the approach of increasing dimensions of the projection optical system would therefore inevitably lead to unfeasibly large dimensions of a projection optical system and lenses comprised therein.

SUMMARY OF THE INVENTION

It is an object of the present invention to provide a projection optical system having a high numerical aperture and a good imaging performance.

In addition, it is an object of the present invention to provide a projection optical system having a compact design, in particular a short length between an object plane (or a first object) and an image plane (or a second object), and/or having lenses of relatively small diameter and/or a relatively small mass of lens material whilst providing a good imaging performance.

In order to achieve the above objects, the present invention provides a projection optical system for imaging a first object into a region of a second object using light of a wavelength shorter than 250 nm, preferably shorter than 200 nm, which comprises: a plurality of lenses disposed along an optical axis of the projection optical system, wherein the plurality of lenses is dividable into four non-overlapping groups of lenses, such that a total refractive power of a first group disposed closest to the first object is a negative refractive power, a total refractive power of a second group disposed directly adjacent to the first group is a positive refractive power, a total refractive power of a third group disposed directly adjacent to the second group is a negative refractive power, a total refractive power of a fourth group disposed directly adjacent to the third group is a positive refractive power, in which projection optical system at least one of the first, second, third and fourth aspect of the present invention, as described in the following, is realised.

In preferred embodiments, a sum of the absolute values of the total refractive powers of the first, second, third and fourth groups is a maximum value (a maximum value in particular in comparison to values obtainable by other possible divisions into groups).

Lens, as used herein, relates to a single lens element, not a optical system comprised of a plurality of lens elements.

The projection optical system is preferably a purely refractive or dioptric projection optical system, i.e. does not comprise reflective optical elements such as mirrors.

The arrangement of a negative lens group followed by a positive lens group, followed by a negative lens group, followed by a positive lens group in the direction of the optical axis (the given order starting at the first object) of the projection optical system according to the present invention results in what is generally referred to as a "single waist type" projection optical system. The waist indicates a constriction or a minimum diameter of the projection optical system. In particular, the waist is formed by lenses of the third group of lenses.

Under a first aspect of the invention, a projection optical system is provided wherein the following relation is fulfilled:

$$2 \cdot y \cdot NA \cdot \frac{1}{k} \cdot \sum_{i=1}^{k} |\varphi_i| \geq V_1 \qquad (1)$$

wherein:
y is half a diameter in mm of a maximum image field imaged by the projection optical system,
NA is a maximum numerical aperture on a side of the second object,
$\phi_i$ is a refractive power in $mm^{-1}$ of the $i^{th}$ lens,
k is a total number of lenses of the projection optical system, and $V_1$ is greater than 0.045.

In exemplary embodiments of the present invention, $V_1$ is greater than 0.055.

In the projection optical system according to the first aspect of the present invention, lenses having comparatively high refractive powers are used and thus an imaging beam used to transfer an image of the first object into a region of the second object may be subject to rather large angles of deflection/incidence. The use of lenses having relatively high refractive powers enables a compact design of the projection optical system, in particular a relatively short distance between the first and the second object as well as use of lenses with a comparatively small diameter. For instance, distances between the first object and the second object as short as about 1000 mm can be realized. A largest diameter of a lens in the projection optical system according to the present invention may be smaller than about 300 mm.

A suitable measure for the extent to which high refractive power lenses are used in the projection optical system is the mean refractive power $\phi_m$ of all lenses in the projection optical system, which is given by the following equation:

$$\varphi_m = \frac{1}{k} \cdot \sum_{i=1}^{k} |\varphi_i| \tag{2}$$

with $\phi_i$ and k as defined above.

A further factor which is important in the design of projection optical systems is the etendue E, which can be expressed as:

$$E = 2 \cdot y \cdot NA \tag{3}$$

Thus, equation (1) can also be written as:

$$E \cdot \phi_m \geq V_1 \tag{4}$$

The inventors of the present inventions found that advantageous, compact designs of projection optical systems with good imaging properties can be realised when a product of $\phi_m$ and E is greater than 0.045, in particular greater than 0.055, as already mentioned above.

Under a second aspect of the present invention, a projection optical system is provided wherein the following relation is fulfilled:

$$2 \cdot y \cdot NA \cdot \sin\left(\frac{1}{k} \cdot \sum_{i=1}^{k} |\delta_{i1}| + |\delta_{i2}|\right) \geq V_2 \tag{5}$$

wherein:
y, NA and k are as defined above,
$\delta_{i1}$ is a maximum deflection angle of imaging beams at a first optical surface of the $i^{th}$ lens,
$\delta_{i2}$ is a maximum deflection angle of imaging beams at a second optical surface of the $i^{th}$ lens,
and wherein $V_2$ is greater than 4.

According to a further exemplary embodiment, $V_2$ is greater than 5.

In a simplified expression, this relation can be described as:

$$\sin(\delta m) \cdot E > V_2 \tag{6}$$

wherein δm is a mean value of the absolute values of the maximum deflection angles of the imaging beams at the surfaces of the lenses of the projection optical system, as defined by $$\frac{1}{k} \cdot \sum |\delta_{i1}| + |\delta_{i2}| \tag{7}$$

in equation (5).

A projection optical system having good imaging properties with deliberate use of at least one of high incidence angles and high deflection angles is quite in contrast to a general teaching that in an optical system, the smaller an angle is at which a light beam is incident onto each lens surface, the less aberrations are generated and the looser a tolerance becomes.

In particular with regard to the use of high refractive power lenses and the occurrence of high angles of incidence/deflection in the projection optical system according to the present invention, a correction of imaging errors such as aberrations can be advantageously carried out by the use of aspherical surfaces in the projection optical system. Imaging errors are defined herein as any deviation of an imaging characteristic from an optimum value of the imaging characteristic.

According to exemplary embodiments of the projection optical system of the present invention, each of at least five leases of the plurality of lenses has at least one aspherical surface. According to an exemplary embodiment, the projection exposure system does not contain more than 10 aspherical surfaces.

Figure 1A:
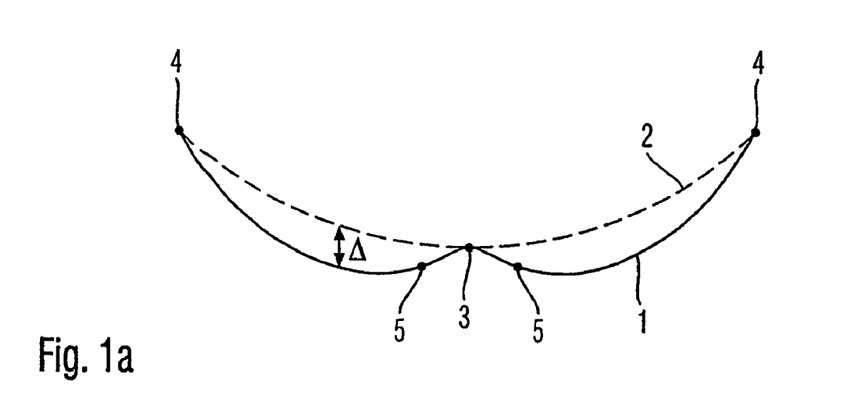
FIG. 1a is a schematic illustration of a radial surface profile of an aspherical surface of a lens.

As used herein, the term "aspherical surface" is to be understood as referring to aspherical surfaces in which a maximum axial distance between the aspherical surface and a best fitting sphere is 2 μm or more. This definition serves to exclude spherical surfaces with unintended deformations as well as aspherical surface parts typically introduced after the manufacture of the lens/projection optical system for correction of aberrations which are generally due to the manufacturing process rather than inherent to the particular design of the projection optical system. For the purpose of describing the degree to which a surface is aspherical, an (imaginary) ideal spherical shape or best fitting sphere is chosen such that a centre and a periphery of the aspherical surface are positioned on the best fitting sphere and then an axial distance between the best fitting sphere and the aspherical surface determined. A radial surface profile and a best fitting sphere chosen in accordance with the above is illustrated in FIG. 1a. The influence of aspherical surfaces on aberrations, in particular the parameters aspherical surfaces offer for enhancing an imaging performance, has been extensively studied, and documented in the literature.

Under a third aspect, a projection optical system is provided wherein each of at least five lenses of the plurality of lenses has at least one aspherical surface and wherein an axial distance between the aspherical surface and a best fitting sphere is more than about 300 μm and less than about 500 μm. As described above, the best fitting sphere is chosen such that a centre and a periphery of the aspherical surface are positioned on the best fitting sphere. The above values indicate that the lens surfaces used are comparatively strongly aspherical, i.e. that a departure from a best fitting sphere is comparatively large. Such aspherical surfaces are preferably positioned in the first group of lenses and/or, if an aperture stop is provided in the projection optical system, close to the aperture stop.

The use of aspherical lenses in the projection optical system helps to reduce the length of the projection optical system and the required amount of lens material as well as to improve an imaging performance.

According to a further exemplary embodiment, an absolute value of a maximum change of curvature of the aspherical surface(s) (dc/ds) is greater than 300 m$^{-2}$.

In exemplary embodiments of the projection optical system, in particular according to the third aspect of the present invention, each of the at least five aspherical surfaces having effective diameters $D_{as}$ has a centre of curvature of the best fitting sphere disposed on a side of the aspherical surface facing away from the lens carrying the aspherical surface, wherein $D_{as}$ is 0.2 times a design-distance $L_D$ between the first object and the second object. In other words, an aspherical surface is preferably disposed on an surface of a lens which surface has an overall concave shape.

Manufacturing lenses having an aspherical surface with an axial distance to the best fitting sphere as large as defined above places high demands on both a manufacturing process itself as well as on an optical testing of a manufactured aspherical surface. For the testing of such surfaces, interferometric techniques are preferably used. For interferometric measurement of an aspherical surface, a wave front of a reference wave front, which the aspherical wave front is compared to, needs to be made aspherical in order to achieve an ideal fit of the wave front to be measured. For this purpose, it is necessary to develop so-called "null-optics" or "null-system", which are capable of generating a suitable aspherical wave front for interferometrically measuring the aspherical surface of the lens. Aspherical surfaces having large deformations and high values in terms of Zernike coefficients require interferometers having refractive systems of such complexity that these refractive systems become virtually impossible and/or economically unfeasible to produce.

A strong deformation of aspherical surfaces generally requires computer-generated holograms. i.e. diffractive systems, to be used in interferometric measurements of the aspherical surfaces. Computer-generated holograms (CGHs), if combined appropriately with a small number of refractive elements or even by themselves, are capable of generating nearly any kind of wave front. However, also computer-generated holograms are subject to practical limits in terms of manufacturability, in particular with respect to their size, due to the limitations imposed by the techniques used in the manufacture of CGHs, such as electron beam, laser beam and photolithographic techniques.

In accordance with one embodiment of the present invention, this problem can be overcome or at least alleviated by placing aspherical surfaces in the projection optical system such that the aspherical surfaces are located on overall concave surfaces of the lenses, as described above. An overall concave surface of a lens is a surface which has a centre of curvature of the best fitting sphere disposed on a side of the aspherical surface facing away from the lens carrying the aspherical surface, as defined above. According to a further exemplary embodiment, all aspherical surfaces which are part of lenses having a maximum diameter larger than about 200 mm are located on overall concave surfaces. According to a further exemplary embodiment, the aspherical surfaces placed in accordance with the above have best fitting spheres associated with them which best fitting spheres have a radius greater than 300 mm and/or smaller than 2000 mm. The lower limit is determined by factors relating to manufacturing and the upper limit determined by a largest feasible length of a "null optics" used in interferometric measuring the aspherical surface.

Projection optical systems having aspherical and spherical surfaces at which angles of deflection/incidence are rather large allow to use relatively small amounts of glass, in particular in terms of a mass of glass, and thus help to decrease cost and weight of the projection optical system.

Under a fourth aspect of the present invention, a projection optical system is provided wherein the following relation is fulfilled:

$$\frac{G_D}{2 \cdot y \cdot NA} \leq V_4 \tag{8}$$

wherein:

y and NA are as defined above and wherein $G_D$ is a sum of all axial thickness of the lenses, wherein the axial thickness of each lens represents a thickness of the lens at a location on the optical axis, and wherein $V_4$ is smaller than 40.

According to an exemplary embodiment, $V_4$ is smaller than 35.

$G_D$ is a suitable indicator of the amount, in particular in terms of mass, of lens material used in the projection optical system and thus cost associated with the lens material.

In exemplary embodiments, the projection optical system comprises an aperture stop disposed between two lenses of the fourth group of lenses. In those embodiments, the fourth group of lenses consists of a first sub-group of lenses in between the first object (or: the third group of lenses, more precisely) and the aperture stop and a second sub-group of lenses in between the aperture stop and the second object.

According to further exemplary embodiments of the present invention, the following condition is fulfilled:

$$\frac{f_1}{f_2} < 0.9 \cdot |\beta| \tag{9}$$

wherein $f_1$ is a focal length of a lens unit consisting of the first, second and third group as well as the first sub-group of the fourth group, $f_2$ is a focal length of the second sub-group of the fourth group, $\beta$ is a magnification of the projection optical system.

In alternative embodiments of the present invention, the following condition is fulfilled:

$$\frac{f_1}{f_2} > 1.1 \cdot |\beta| \tag{10}$$

with $f_1$, $f_2$ and $\beta$ as defined above.

The mismatch of the focal length of the lens unit comprising all lenses in between the aperture stop and the first object, and focal length of the second sub-group of the fourth group of lenses which comprises all lenses in between the aperture stop and the second object, serves to create an a focal projection optical system.

According to exemplary embodiments of the projection optical system of the present invention, the following condition is fulfilled:

$$\frac{L_D \cdot D_{beam} \cdot \log\left(\frac{1}{NA}\right)}{100 \cdot FD} < 3 \tag{11}$$

wherein $L_D$ is a design-distance between the first object and the second object, $D_{beam}$ is a maximum diameter of a beam bundle, NA is the maximum numerical aperture on the side of the second object, and FD is a maximum field-height of the first object.

The term "design distance" or "design length" as used herein stands for a distance between the first object and the second object in an operating or exposure mode, i.e. as foreseen by the design of the projection optical system when both the first and second objects are in focus.

According to exemplary embodiments of the projection optical system of the present invention, a radial surface profile of an aspherical surface has at most one point of inflection of curvature. According to a further exemplary embodiment, a radial surface profile of at most one aspherical surface has a point of inflection of curvature in an optically effective area of the aspherical surface. Since an aspherical surface is generally rotationally symmetrical, one point of inflection, as used herein, would encompass embodiments wherein the point of inflection extends in a given shape, in particular a circle, across the surface of the aspherical surface. The radial surface profile shown in FIG. 1a, for instance, would fall within the meaning of an aspherical surface having just one point of inflection.

According to an exemplary embodiment, a focal length of the projection optical system is shorter than 250 mm. The choice of this particular focal length enables the realisation of good telecentric properties of the projection optical system, in particular on a side of the second object.

In exemplary embodiments of the projection optical system according to the present invention, at least one lens in the second sub-group of the fourth group of lenses is a lens of positive refractive power and the at least one lens fulfils the following conditions:

$$i_1 \cdot (u_{1i} + u_{1o}) + i_2 \cdot (u_{2i} + u_{2o}) > 2.5 \text{ and } f_{4p} < 2500 \text{ mm} \tag{12}$$

wherein $i_1$ is a maximum angle of incidence of an imaging beam on a first surface of the at least one lens, $i_2$ is a maximum angle of incidence of the imaging beam on a second surface of the at least one lens, $u_{1i}$ is a maximum angle formed between the imaging beam and the optical axis at the first surface outside of the at least one lens, $u_{2i}$ is a maximum angle formed between the imaging beam and the optical axis at the second surface inside of the at least one lens, $u_{1o}$ is a maximum angle formed between the imaging beam and the optical axis at the first surface inside of the at least one lens, $u_{2o}$ is a maximum angle formed between the imaging beam and the optical axis at the second surface outside of the at least one lens, and $f_{4p}$ focal length of the at least one lens.

Figure 1B:
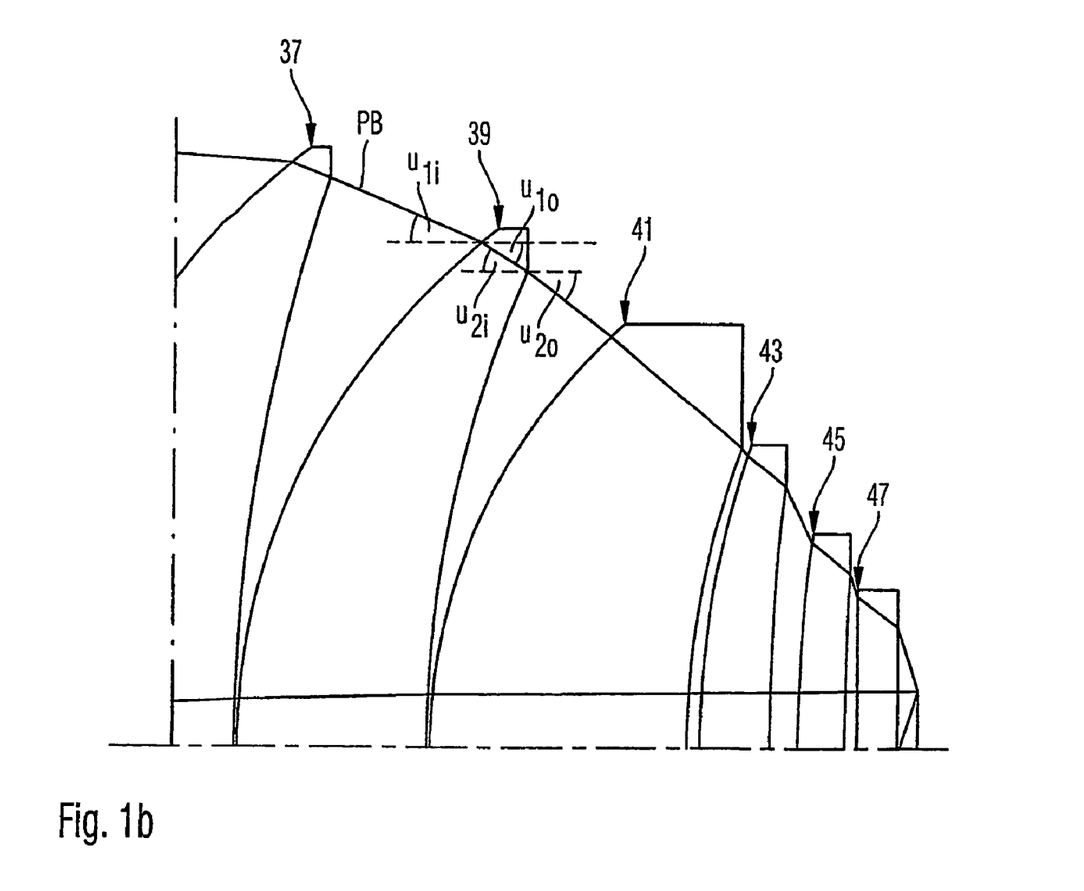
FIG. 1b is an illustration of angles of incidence and deflection on two surfaces of a lens.

The angles referred to above are shown schematically in FIG. 1b. The restriction with respect to the focal length of the at least one lens serves to exclude trivial cases of plane parallel plates.

According to an exemplary embodiment of the present invention, the first group of lenses is comprised only of lenses having negative refractive power, wherein one of the lenses of the first group is a meniscus lens having a convex surface facing the first object.

According to exemplary embodiments of the present invention, the second group of lenses is comprised only of lenses having positive refractive power, wherein at least one of the lenses of the second group has a (overall) concave, aspherical surface. According to a further exemplary embodiment of the present invention, the second group of lenses comprises at least three lenses.

According to an exemplary embodiment of the present invention, at least one lens of the third group of lenses has an aspherical surface.

According to further exemplary embodiments of the invention, the third group of lenses is comprised only of lenses having negative refractive power.

According to further exemplary embodiments of the present invention, the third group of lenses comprises three or more lenses of negative refractive power. According to further exemplary embodiments, a lens having positive refractive power is disposed between two lenses having negative refractive power in the third group of lenses.

Embodiments of the projection optical system according to the present invention have proven to be advantageous when the first sub-group of the fourth group of lenses comprises at least one lens of negative refractive power, which lens has a first and a second surface and fulfils the following condition:

$$\left|\frac{c_{11} + c_{12}}{c_{11} - c_{12}}\right| < -0.5 \tag{13}$$

wherein $C_{11}$ is a curvature of the first surface of the at least one lens and $C_{12}$ is a curvature of the second surface of the at least one lens.

According to a further exemplary embodiment, the first sub-group of the fourth group of lenses comprises two to four lenses of positive refractive power.

According to a further exemplary embodiment, the first sub-group of the fourth group of lenses (also) comprises at least one lens of negative refractive power having a first and a second surface, which lens fulfils the following condition:

$$\left|\frac{c_{21} + c_{22}}{c_{21} - c_{22}}\right| > 0.5 \tag{14}$$

wherein $c_{21}$ is a curvature of the first surface of the at least one lens and $c_{22}$ is a curvature of the second surface of the at least one lens.

According to a further exemplary embodiment of the present invention, the second sub-group of the fourth group of lenses comprises only one lens having negative refractive power.

According to a further exemplary embodiment, the second sub-group of the fourth group of lenses comprises a lens having negative refractive power disposed adjacent to a lens having positive refractive power, with the lens having positive refractive power being positioned closer to the second object (than the lens having negative refractive power), and wherein the negative lens fulfils the following condition:

$$\left|\frac{c_{31}+c_{32}}{c_{31}-c_{32}}\right| < -0.5 \tag{15}$$

wherein $c_{31}$ is a curvature of the first surface of the at least one lens and $c_{32}$ is a curvature of the second surface of the at least one lens.

According to further exemplary embodiments of the present invention, the second sub-group of the fourth group of lenses comprises a lens having positive refractive power disposed adjacent to a lens having negative refractive power, with the lens having negative refractive power being positioned closer to the second object, and wherein the negative lens fulfils the following condition:

$$\left|\frac{c_{41}+c_{42}}{c_{41}-c_{42}}\right| > 0.5 \tag{16}$$

wherein $c_{41}$ is a curvature of the first surface of the at least one lens and $c_{42}$ is a curvature of the second surface of the at least one lens.

According to exemplary embodiments of the present invention, the second sub-group of the fourth group of lenses comprises no less than two and no more than four positive meniscus lenses having their concave surfaces facing the second object. This embodiment is helpful in realising an aplanatic design.

In exemplary embodiments of the present invention, the first group of lenses contains a maximum of two aspherical lenses, the second group of lenses contains a maximum of two aspherical lenses, the third group of lenses contains a maximum of one aspherical lens, the first sub-group of the fourth group of lenses contains a maximum of three aspherical lenses, and the second sub-group of the fourth group of lenses contains a maximum of three aspherical lenses. According to an exemplary embodiment of the present invention, each of those aspherical lenses has only one aspherical surface.

According to an exemplary embodiment of the present invention, in the second sub-group of the fourth group of lenses, any lens having an aspherical surface has the aspherical surface on a side of the lens facing the second object.

According to a further exemplary embodiment, in the first group of lenses, any lens having an aspherical surface has the aspherical surface on a side of the lens facing the first object.

It is advantageous if in embodiments of the projection optical system according to the invention, the following condition is fulfilled:

$$\frac{L_D}{G_D} > 1.4 \tag{17}$$

wherein $G_D$ is the sum of axial thickness of all the lenses, as defined above, $L_D$ is the design-distance between the first object and the second object.

The choice of a suitable lens material or suitable lens materials depends largely on the wavelength of light used in the imaging beams and thus for exposure of the second object. Desirably, the lens material is not prone to significant radiation-induced damage such as increased transmission or a change in refractive index caused by phenomena such as compaction and rarefaction and should ideally exhibit low birefringence, both stress induced and intrinsic birefringence.

An appropriate choice and placement of lens material(s) allows correction of chromatic aberrations in the projection optical system and thus somewhat alleviates the demands placed on the optical design of the projection optical system.

Fused silica, in particular synthetic fused silica, is the most common material used in projection exposure systems employing short wavelengths for exposure, such as 193 nm. The susceptibility of fused silica materials to UV-induced damage is correlated with the materials' chemical and physical properties, which, in turn, are closely linked to methods of manufacturing and/or treating the material(s). Upon exposure to high intensity radiation, exposed areas of a lens of a given material have been found to undergo a change in density, in particular densification or rarefaction. The change in density of an exposed area in a lens in a projection exposure apparatus can generally be assumed to have a detrimental effect on the optical properties of the lens. In particular, wavefront distortion is indicative of densification or rarefaction and can be measured and determined by suitable interferometric methods, for example. An increase in density, for instance, of the lens material shortens the physical path through the material, but also alters the refractive index, which is generally increased to a greater extent, so that the net effect is an increase in the optical path. For rarefaction phenomena, the opposite applies.

A lens material that is transparent to UV-radiation and which has, at least so far, not been found to be subject to such structural alterations that are associated with changes in optical properties is calcium fluoride, $CaF_2$. Therefore, calcium fluoride is a suitable material at wavelengths in the deep ultraviolet, such as 193 nm and 157 nm, which are typically used. In addition, other earth alkaline fluoride materials are suitable lens materials with properties similar to that of calcium fluoride. Due to radiation-induced damage found in silica materials, calcium fluoride is the lens material of choice when it comes to prolongation of a life-time of the projection optical system and thus the corresponding projection exposure system. However, for calcium fluoride to be suitable for use in optical lenses, it needs to be in the form of single crystals which are not only costly but also technically difficult to manufacture so that the resulting limited supply somewhat constrains its practical use.

In one embodiment of the present invention, all lenses are made of calcium fluoride. In an alternative embodiment, all lenses are made of silica, in particular fused silica.

In further embodiments, one or more lens materials, in particular crystalline materials, may be used as lens materials. In those embodiments, the lens materials/crystalline materials may comprise a fluoride material, such as calcium fluoride, barium fluoride and other suitable fluorides.

According to exemplary embodiments of the projection optical system of the present invention, one or more of the four lenses disposed closest to the second object are made of a fluoride material, wherein a crystal orientation of the fluoride material in the one or more lenses with respect to the optical axis is the same in two or more lenses. For instance, all four lenses may be made of <110> fluorite material, wherein the particular chosen crystal lattice is arranged in one predefined orientation with respect to the optical axis for all four lenses. According to a further exemplary embodiment, one ore more lenses of the third group of lenses is made of a fluoride material in order to help prolong the life-time of the projection optical system.

According to further exemplary embodiments of the present invention, one or more lenses of the second group of lenses is made of a fluoride material. Preferably, one of the positive lenses in the fourth group of lenses is made of a fluoride material. Those embodiments are particularly advantageous in terms of a correction of chromatic aberrations, in particular in terms of a reduction of a lateral chromatic aberration.

When calcium fluoride or another fluoride material is used in one or more lenses of the projection optical system, preferably, diameter, thickness and crystal orientation of the fluoride used in the lenses are chosen such that a loss in contrast due to intrinsic birefringence is less than 0.5%.

The aperture stop used in exemplary embodiments of the present invention is preferably adjustable. In order to enable very compact designs of projection optical systems, exemplary embodiments of the present invention have an adjustable aperture stop wherein an axial position of an aperture formed by the aperture stop varies with a size of the aperture, wherein the axial position of the aperture is defined by an intersection of a plane defined by the aperture, i.e. a plane containing the aperture, and the optical axis.

According to exemplary embodiments of the present invention, the adjustable aperture stop comprises lamellae having an essentially planar shape. Alternatively, the adjustable aperture stop may comprise lamellae essentially all of which have an identical spherical shape. An example of such an aperture is described in U.S. Pat. No. 6,445,510, filed on Oct. 4, 2000, to the same Assignee, the entire contents of which is incorporated by reference herein. Apertures wherein the axial position of the aperture varies with the size of the aperture are advantageously used to enable a lens in front of the aperture and a lens behind the aperture (in the direction of light propagating in a direction from the first to the second object) being disposed very closely together, i.e. to reduce a necessary spacing in between these two lenses. This ability creates further possibilities in the design of projection optical system since the previous requirements for a large spacing in between lenses directly adjacent to the aperture stop are no longer given.

The projection optical system according to the present invention generally has a high a numerical aperture of the projection optical system on a side of the second object, in exemplary embodiments the numerical aperture is greater than 0.91.

According to further exemplary embodiments of the present invention, the fourth lens group comprises at least one pair of immediately adjacent lenses, wherein a first lens of the pair of lenses has a first and a second surface and a second lens of the pair of lenses has a third surface and a fourth surface, and wherein the first, second, third and fourth surfaces are disposed along the optical axis in this order, and wherein the following conditions are fulfilled:

$$d < V_5 \quad (18)$$

$$\left| \frac{c_{51} + c_{52}}{c_{51} - c_{52}} \right| > V_6$$

$$c_{51} > V_7$$

wherein
d is a maximum distance between the second surface and the third surface,
$c_{51}$ is a curvature of the first surface,
$c_{52}$ is a curvature of the fourth surface, and
$V_5$=15 mm, $V_6$=10, $V_7$=0.003 mm$^{-1}$.

According to further exemplary embodiments, $V_5$=10 mm and/or $V_6$=15 and/or $V_7$=0.004 mm$^{-1}$.

In those embodiments, the first surface and the fourth surface, i.e. two surfaces of two different lenses, practically form a meniscus lens, in particular the optical surfaces of a meniscus lens. This arrangement has proven to be advantageous for the imaging properties of the projection optical system in particular in projection optical systems of a compact design, i.e. a short design length between the first and the second object and relatively small maximum diameters of the lenses comprised in the projection optical system.

The projection optical system according to the present invention enables the realization of a compact design, in particular a short design length between the first and the second object and comparatively small maximum diameters of lenses, as well as low chromatic aberrations.

Under a further aspect of the present invention, a projection exposure system is provided, which comprises: an illumination optical system for generating a light beam of light having a wavelength shorter than 250 nm, a mount for mounting a patterning structure as a first object, a substrate mount for mounting a radiation sensitive substrate as a second object, and the projection optical system according to the present invention, as described above, for imaging the first object into a region of the second object.

Under another aspect of the present invention, a method of manufacturing a microstructured device is provided, comprising: using a projection exposure system, comprising an illumination optical system for generating a light beam of light having a wavelength shorter than 250 nm, a mount for mounting a patterning structure as a first object, a substrate mount for mounting a radiation sensitive substrate as a second object, and the projection optical system according to the present invention, as described above, for imaging the first object into a region of the second object, and imaging the patterning structure onto the radiation sensitive substrate with the light beam of the light having a wavelength shorter than 250 nm.

A further aspect of the present invention relates to a microstructured device manufactured by the above method.

BRIEF DESCRIPTION OF THE DRAWINGS

In the following, embodiments of the present invention are explained in further detail with reference to Figures, wherein.

DESCRIPTION OF THE EXEMPLARY EMBODIMENTS

FIG. 1a shows a schematic representation of a radial surface profile of an aspherical surface 1 with a corresponding best fitting sphere 2 fitted thereto. Point 3 indicates the centre of the aspherical surface and points 4 indicate the periphery of the aspherical surface. Point 5 indicates a point of inflection of the curvature of the aspherical lens. Since the depicted aspherical surface is rotationally symmetrical, point of inflection 5 extends in a circle across the aspherical surface, such that the aspherical surface, in the terminology used herein, would be regarded as having only one point of inflection. Δ indicates a departure from the best fitting sphere, i.e. an axial distance between the aspherical surface and the ideal sphere best fitted thereto.

FIG. 1*b* shows an excerpt of a lens of an embodiment of a projection optical system according to the present invention, wherein $u_{1i}$ as the maximum angle formed between the imaging beam and the optical axis at the first surface outside of the lens, $u_{2i}$ as the maximum angle formed between the imaging beam and the optical axis at the second surface inside of the lens, $u_{1o}$ as the maximum angle formed between the imaging beam and the optical axis at the first surface inside of the lens, $u_{2o}$ as the maximum angle formed between the imaging beam and the optical axis at the second surface outside of the lens, are marked for illustration purposes.

Figure 2:
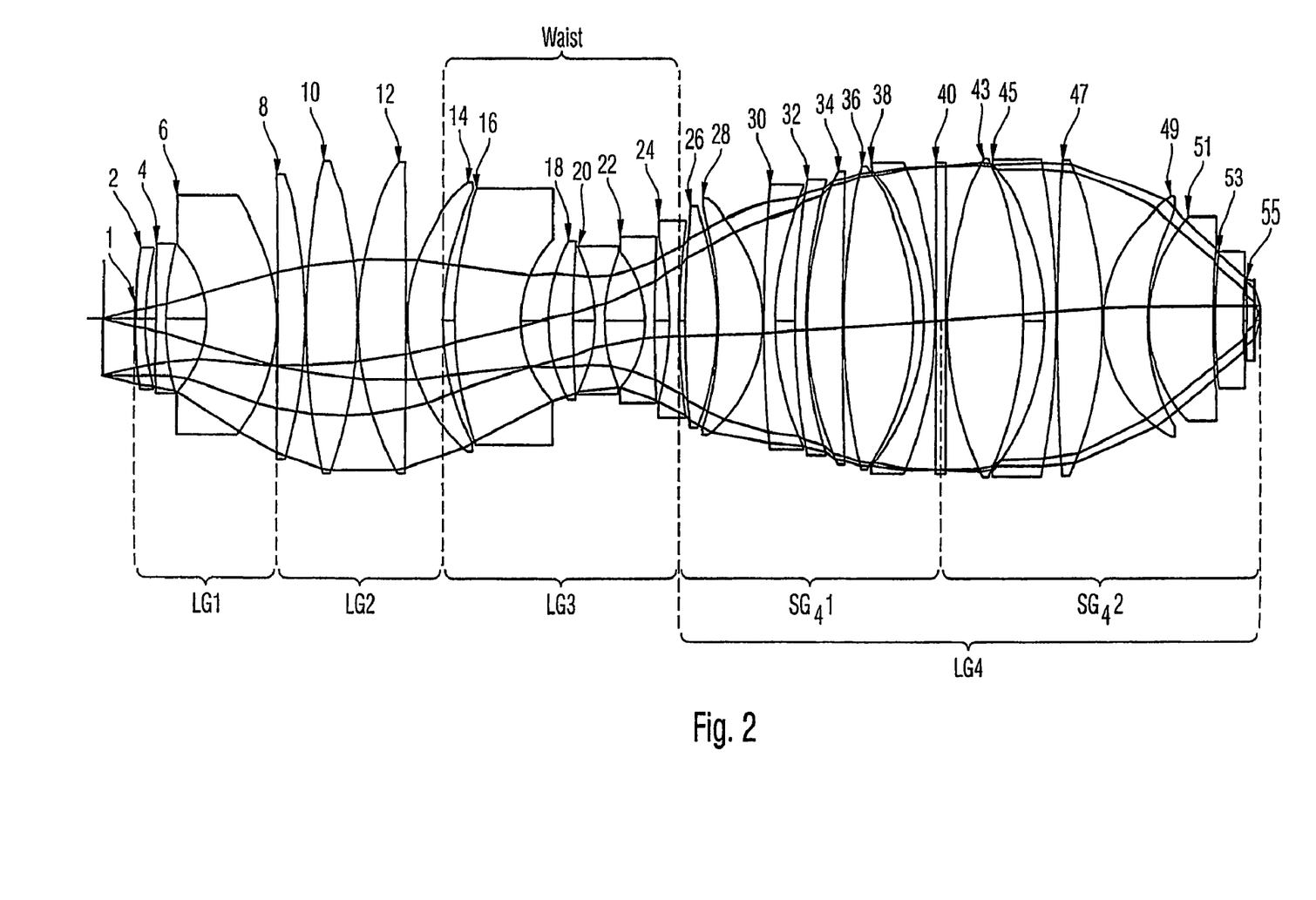
FIG. 2 is an optical path diagram of a first embodiment of a projection optical system according to the present invention.

In FIG. 2, an optical Path diagram of a first embodiment of a projection optical system according to the present invention is depicted. As indicated by the brackets, the first group of lenses LG1 includes 3 lenses and has negative refractive power, the second group of lenses LG2 includes 4 lenses and has positive refractive power, the third group of lenses LG3 includes 5 lenses and has negative refractive power, the first subgroup $SG_41$ of the fourth group of lenses LG4 includes 7 lenses and has positive refractive power, the second subgroup $SG_42$ of the fourth group of lenses LG4 includes 7 lenses and has positive refractive power. Overall, the projection optical system includes 26 lenses. The fourth group of lenses LG4 also includes an aperture stop in between the first and the second subgroup.

Detailed information on lens parameters such as thickness of the lens, lens material, radius of the optical surface and diameter of the lens are listed in Table 1. In addition, an indication of a position of aspherical surfaces in the projection optical system and their parameters are given in Table 1. An aspherical surface can be characterised by the following equation:

$$p(h) = \frac{\frac{h^2}{r}}{1+\sqrt{1-(1+K)\frac{h^2}{r^2}}} + C1 \cdot h^4 + C2 \cdot h^6 + \ldots \quad (19)$$

wherein r radius of curvature in the apex of the aspherical surface (paraxial curvature), h distance of a point on the aspherical surface from the optical axis (or height of the aspherical surface from the optical axis), p(h) is the sag of the surface in axial direction, i.e. a distance along the direction of the optical axis from a tangent plane to a vertex of the aspheric surface, K conical coefficients and C1 ... C6 aspherical coefficients.

As evident from Table 1, the first embodiment of a projection optical system contains 10 aspherical surfaces, all of which are disposed on overall concave lens surfaces. The projection optical system of the first embodiment is designed for imaging beams having 193 nm wavelength.

TABLE 1

| Surface | Radius | Thickness | Lens material | Diameter |
|---|---|---|---|---|
| 0 | 0.000 | 32.000 |  | 112.16 |
| 1 | 0.000 | 0.798 |  | 128.31 |
| 2 | 1031.476 | 10.000 | 'SiO₂HL' | 130.89 |
| 3 | 275.197 | 10.624 |  | 133.40 |
| 4 | −1229.209 | 10.000 | 'SiO₂HL' | 134.92 |
| 5 | 283.300 | 40.275 |  | 141.17 |
| 6 | −103.631 | 70.049 | 'SiO₂HL' | 143.47 |
| 7 | −183.668 | 1.000 |  | 220.25 |
| 8 | −11585.541 | 27.459 | 'SiO₂HL' | 260.83 |
| 9 | −473.064 | 1.000 |  | 266.76 |
| 10 | 677.737 | 51.525 | 'SiO₂HL' | 292.01 |
| 11 | −420.149 | 1.000 |  | 294.30 |
| 12 | 299.116 | 48.633 | 'SiO₂HL' | 293.24 |
| 13 | −8515.515 | 1.000 |  | 289.64 |
| 14 | 165.992 | 36.044 | 'SiO₂HL' | 250.25 |
| 15 | 274.140 | 11.842 |  | 239.88 |
| 16 | 351.874 | 66.976 | 'SiO₂HL' | 236.90 |
| 17 | 113.149 | 27.726 |  | 157.71 |
| 18 | 159.540 | 25.025 | 'SiO₂HL' | 149.32 |
| 19 | 1008.355 | 21.895 |  | 142.58 |
| 20 | −152.924 | 10.000 | 'SiO₂HL' | 139.65 |
| 21 | 155.990 | 40.933 |  | 131.75 |
| 22 | −100.703 | 10.000 | 'SiO₂HL' | 132.11 |
| 23 | 2203.235 | 14.695 |  | 156.09 |
| 24 | −297.997 | 10.000 | 'SiO₂HL' | 159.08 |
| 25 | 630.640 | 6.141 |  | 185.24 |
| 26 | 1026.503 | 32.293 | 'SiO₂HL' | 195.25 |
| 27 | −289.676 | 1.000 |  | 204.47 |
| 28 | −446.572 | 45.387 | 'SiO₂HL' | 209.56 |
| 29 | −141.103 | 1.000 |  | 218.42 |
| 30 | 1251.841 | 11.400 | 'SiO₂HL' | 239.86 |
| 31 | 278.497 | 19.855 |  | 245.36 |
| 32 | 696.209 | 11.400 | 'SiO₂HL' | 247.88 |
| 33 | 473.704 | 1.000 |  | 256.80 |
| 34 | 330.852 | 35.966 | 'SiO₂HL'' | 271.36 |
| 35 | 4411.497 | 1.000 |  | 274.35 |
| 36 | 597.458 | 70.550 | 'SiO₂HL' | 283.42 |
| 37 | −250.280 | 10.735 |  | 284.92 |
| 38 | −211.754 | 11.400 | 'SiO₂HL' | 283.44 |
| 39 | −367.920 | 1.022 |  | 292.91 |
| 40 | 0.000 | 10.000 | 'SiO₂HL' | 291.79 |
| 41 | 0.000 | −6.209 |  | 292.85 |
| STO | 0.000 | 7.653 |  | 291.65 |
| 43 | 336.127 | 77.330 | 'SiO₂HL' | 300.00 |
| 44 | −352.638 | 21.376 |  | 297.91 |
| 45 | −240.225 | 12.078 | 'SiO₂HL' | 295.04 |
| 46 | −771.704 | 1.000 |  | 299.02 |
| 47 | 2064.728 | 45.378 | 'SiO₂HL' | 297.01 |
| 48 | −368.429 | 1.000 |  | 295.99 |
| 49 | 128.930 | 44.704 | 'SiO₂HL' | 221.85 |
| 50 | 222.899 | 1.000 |  | 208.75 |
| 51 | 142.963 | 65.247 | 'SiO₂HL' | 191.87 |
| 52 | 1352.559 | 1.704 |  | 139.24 |
| 53 | 547.791 | 28.608 | 'SiO₂HL' | 128.60 |
| 54 | 784.739 | 2.695 |  | 85.44 |
| 55 | 0.000 | 8.000 | 'SiO₂HL' | 76.26 |
| 56 | 0.000 | 6.000 |  | 64.01 |
| 57 | 0.000 | 0.000 |  | 28.04 |

Aspherical surfaces

Surface 2

K: 0.000000
A: 0.179210E−06   B: −.183601E−10   C: 0.166069E−14
D: −.294001E−18   E: 0.883907E−22   F: −.163553E−25
G: 0.125411E−29   H: 0.000000E+00   J: 0.000000E+00

Surface 4

K: 0.000000
A: 0.766695E−07   B: 0.781019E−11   C: −.117892E−14
D: 0.172623E−18   E: −.547425E−22   F: 0.100176E−25
G: −.755382E−30   H: 0.000000E+00   J: 0.000000E+00

Surface 15

K: 0.000000
A: 0.136312E−07   B: −.992470E−13   C: −.345322E−17

TABLE 1-continued

| | | |
|---|---|---|
| D: 0.206018E−21 | E: −.443982E−25 | F: 0.210515E−29 |
| G: −.746796E−34 | H: 0.000000E+00 | J: 0.000000E+00 |
| | Surface 21 | |
| | | |
| K: 0.000000 | | |
| A: −.225645E−07 | B: −.505339E−11 | C: −.133289E−15 |
| D: 0.366375E−19 | E: −.737639E−23 | F: 0.159483E−26 |
| G: −.149942E−30 | H: 0.000000E+00 | J: 0.000000E+00 |
| | Surface 28 | |
| | | |
| K: 0.000000 | | |
| A: −.304506E−07 | B: 0.297866E−12 | C: 0.296080E−16 |
| D: −.224605E−20 | E: 0.320081E−24 | F: −.176893E−28 |
| G: 0.398957E−33 | H: 0.000000E+00 | J: 0.000000E+00 |
| | Surface 33 | |
| | | |
| K: 0.000000 | | |
| A: 0.893991E−08 | B: −.381137E−13 | C: −.103082E−18 |
| D: −.345423E−22 | E: −.117217E−25 | F: 0.129547E−29 |
| G: −.287147E−34 | H: −.311364E−39 | J: 0.000000E+00 |
| | Surface 38 | |
| | | |
| K: 0.000000 | | |
| A: 0.346098E−08 | B: 0.239948E−13 | C: 0.837128E−18 |
| D: −.842934E−22 | E: 0.107693E−25 | F: −.727735E−30 |
| G: 0.394912E−34 | H: −.105875E−38 | J: 0.000000E+00 |
| | Surface 45 | |
| | | |
| K: 0.000000 | | |
| A: −.240529E−09 | B: −.193202E−12 | C: 0.332296E−17 |
| D: 0.154348E−21 | E: −.251137E−25 | F: 0.174127E−29 |
| G: −.574851E−34 | H: 0.814458E−39 | J: 0.000000E+00 |
| | Surface 50 | |
| | | |
| K: 0.000000 | KC: 100 | |
| A: 0.664683E−08 | B: 0.803136E−12 | C: −.257217E−16 |
| D: 0.827303E−20 | E: −.204820E−23 | F: 0.261228E−27 |
| G: −.194941E−31 | H: 0.632538E−36 | J: 0.000000E+00 |
| | Surface 52 | |
| | | |
| K: 0.000000 | | |
| A: 0.273186E−07 | B: 0.812461E−11 | C: −.105427E−14 |
| D: 0.485865E−19 | E: 0.267241E−22 | F: −.580414E−26 |
| G: 0.370026E−30 | H: −.782824E−35 | J: 0.000000E+00 |

As apparent from FIG. 2, the first group of lenses includes 2 meniscus lenses, one meniscus lens having a concave side facing the second object, one meniscus lens having a concave side facing in the direction of the first object. The first group of lenses has rather high negative refractive power, and requires only three lenses to achieve a strong divergence of the imaging beam bundle.

A waist is formed by the third group of lenses LG3, which waist is required for Petzval correction. The third group of lenses LG3 imparts a strong divergence on the imaging beam. A first lens arrangement ("belly") is formed by the first and second group of lenses LG1 and LG2 and a second lens arrangement ("belly") is formed by the fourth group of lenses LG4. The third and fourth lens of the first subgroup $SG_41$ of the fourth group of lenses LG4, both of which are meniscus lenses having a concave surface facing in the direction of the second object, provide strong deflection angles. In the second subgroup $SG_42$ of the fourth group of lenses LG4, optical surfaces 45 and 48, i.e. a first surface of the second lens of the second subgroup and the second surface of the third lens of the subgroup together form a meniscus lens. A second surface 46 of the second lens and a first surface 47 of the third lens are disposed in very close proximity.

In Table 2, characteristic parameters of the first embodiment of the present invention are listed.

TABLE 2

| | |
|---|---|
| NA | 0.95 |
| E [mm] | 26.638 |
| $\phi_m$ [mm$^{-1}$] | 2.29e−3 |
| $\phi_m \cdot E$ | 0.061 |
| δm in ° | 14.73 |
| sin(δm) · E [mm] | 6.77 |
| $G_D$ [mm] | 885.5 |
| $G_D/E$ | 33.2 |
| dc/ds max in m$^{-2}$ | 574 |

As can be seen from Tables 1 and 2, a first, second, third and fourth aspect of the invention are realised in the first embodiment.

Figure 3:
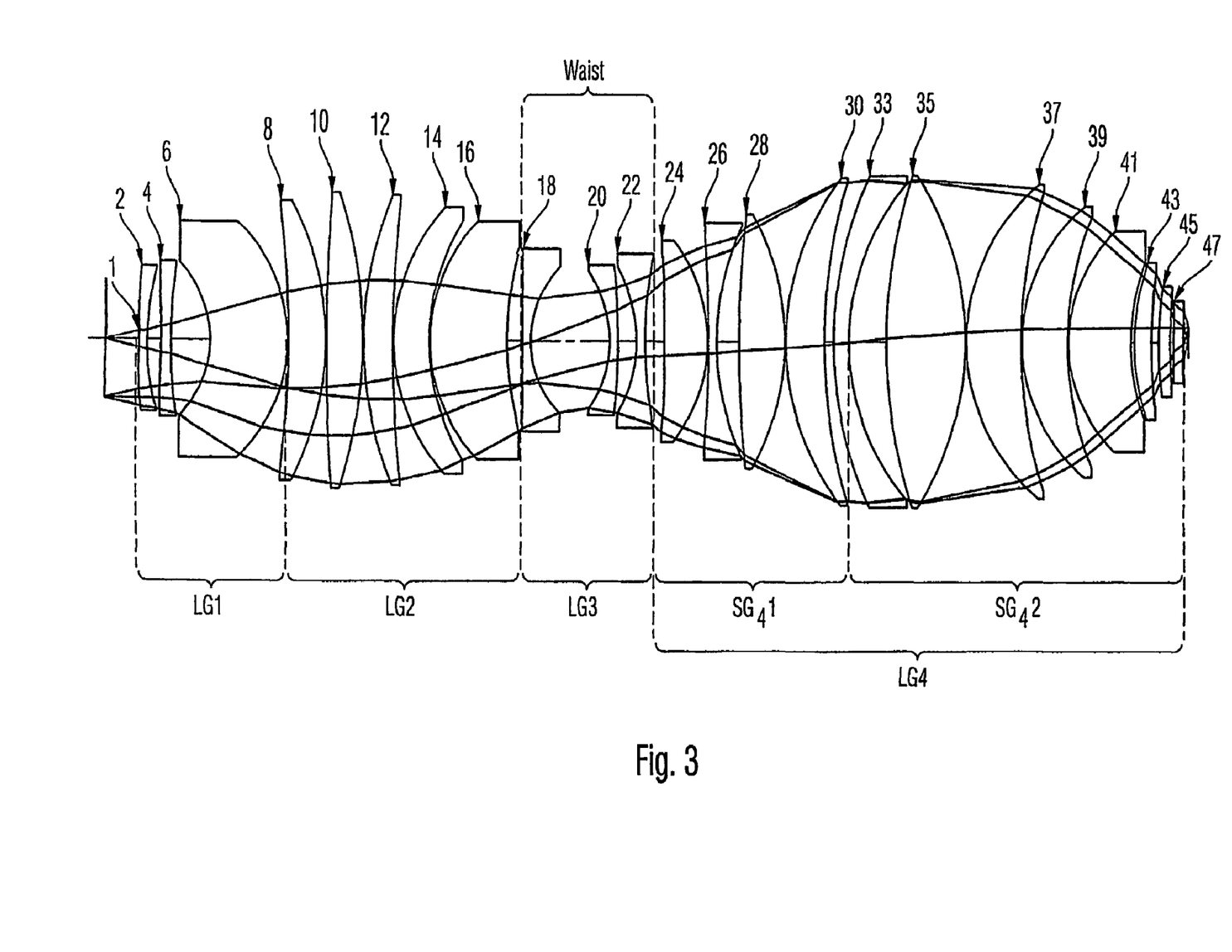
FIG. 3 is an optical path diagram of a second embodiment of a projection optical system according to the present invention.

In FIG. 3, an optical path diagram of a second embodiment of a projection optical system according to the present invention is depicted. As indicated by the brackets, the first group of lenses LG1 includes three lenses of negative refractive power, the second group of lenses LG2 includes five lenses and has positive refractive power, the third group of lenses LG3 includes three lenses of negative refractive power and forms the waist of the projection optical system. The first subgroup $SG_41$ of the fourth group LG4 includes four lenses and the second subgroup $SG_42$ of the fourth group of lenses LG4 includes 8 lenses, with the fourth lens group LG4 having positive refractive power. The fourth lens group LG4 further comprises an adjustable aperture stop, wherein the aperture stop comprises lamellae which, when changing a size of the aperture, can be moved on a lateral surface of a spherical shape. Thus, rather than providing an aperture which is fixed at a certain position of the optical axis during adjustment, an adjustable aperture stop is provided the lamellae of which are shaped and arranged such that upon decreasing a size of the aperture, the lamellae move into the light path along a spherical shape. Therefore, the last lens of the first subgroup $SG_41$ and the first lens of the second subgroup $SG_42$ can be disposed in close vicinity to each other. The last lens of the third group LG3 and the first lens of the first subgroup $SG_41$ form a first doublet, and the second and third lens of the first subgroup $SG_41$ form a second doublet. Lens surface 27 is a surface which is concave with respect to a direction of the second object, at which surface the imaging beams are subject to rather large angles of incidence and deflection. This lens surface has a strong correcting effect, in particular with respect to coma and spherical aberrations of the projection optical system. Lens surface 31 of the last lens of the first subgroup $SG_41$ and lens surface 34 of the first lens of the second subgroup $SG_42$ together form a meniscus lens. The last lens of the first subgroup is also of importance due to the large angle of deflection/incidence it imposes onto the imaging beam. In between the first and the second lens of the second subgroup $SG_42$, an air lens is formed. The second lens of the second subgroup $SG_42$ has a high positive refractive power.

Detailed information on lens parameters such as thickness of the lens, lens material, radius of the optical surface and diameter of the lens are listed in Table 3. In addition, an indication of a position of aspherical surfaces in the projection optical system and their parameters are given in Table 3. As evident from Table 3, the second embodiment of a projection optical system contains 10 aspherical surfaces, all of which are disposed on overall concave lens surfaces.

In Table 4, characteristic parameters of the second embodiment of the present invention are listed.

TABLE 3

| Surface | Radius | Thickness | Lens material | Diameter |
|---|---|---|---|---|
| 0 | 0.000 | 32.000 | 'AIRV193' | 112.16 |
| 1 | 0.000 | 0.000 | 'AIRV193' | 127.77 |
| 2 | 57573.384 | 8.000 | 'SiO$_2$V' | 128.94 |
| 3 | 243.811 | 13.262 | 'N2VP950' | 132.25 |
| 4 | −1090.143 | 9.354 | 'SiO$_2$V' | 134.84 |
| 5 | 466.146 | 37.485 | 'N2VP950' | 141.26 |
| 6 | −105.489 | 75.000 | 'SiO$_2$V' | 144.45 |
| 7 | −148.914 | 0.700 | 'N2VP950' | 214.83 |
| 8 | −934.567 | 36.244 | 'SiO$_2$V' | 247.24 |
| 9 | −274.035 | 0.700 | 'N2VP950' | 254.54 |
| 10 | 1877.003 | 35.146 | 'SiO$_2$V' | 267.24 |
| 11 | −433.158 | 0.700 | 'N2VP950' | 268.74 |
| 12 | 340.474 | 28.340 | 'SiO$_2$V' | 263.65 |
| 13 | 1177.958 | 0.700 | 'N2VP950' | 260.39 |
| 14 | 180.585 | 34.561 | 'SiO$_2$V' | 242.61 |
| 15 | 206.758 | 0.700 | 'N2VP950' | 224.36 |
| 16 | 155.939 | 75.000 | 'SiO$_2$V' | 216.75 |
| 17 | 281.771 | 15.027 | 'N2VP950' | 171.22 |
| 18 | 15953.616 | 8.000 | 'SiO$_2$V' | 166.15 |
| 19 | 98.432 | 77.068 | 'N2VP950' | 137.11 |
| 20 | −111.308 | 8.019 | 'SiO$_2$V' | 128.52 |
| 21 | −702.509 | 18.031 | 'N2VP950' | 136.29 |
| 22 | −138.076 | 8.362 | 'SiO$_2$V' | 137.45 |
| 23 | 416.972 | 18.694 | 'N2VP950' | 158.20 |
| 24 | −11234.170 | 41.874 | 'SiO$_2$V' | 170.34 |
| 25 | −150.893 | 0.700 | 'N2VP950' | 182.81 |
| 26 | −1297.101 | 8.000 | 'SiO$_2$V' | 199.72 |
| 27 | 253.311 | 21.736 | 'N2VP950' | 215.55 |
| 28 | 1068.917 | 45.071 | 'SiO$_2$V' | 223.06 |
| 29 | −236.445 | 0.700 | 'N2VP950' | 231.38 |
| 30 | 244.024 | 37.656 | 'SiO$_2$V' | 298.50 |
| 31 | 555.375 | 27.303 | 'N2VP950' | 297.24 |
| 32 | 0.000 | −18.174 | 'N2VP950' | 298.02 |
| 33 | 360.544 | 15.000 | 'SiO$_2$V' | 302.13 |
| 34 | 221.881 | 36.472 | 'N2VP950' | 295.96 |
| 35 | 488.301 | 77.125 | 'SiO$_2$V' | 299.83 |
| 36 | −279.915 | 0.700 | 'N2VP950' | 303.00 |
| 37 | 187.876 | 53.225 | 'SiO$_2$V' | 285.84 |
| 38 | 489.307 | 0.700 | 'N2VP950' | 278.37 |
| 39 | 163.275 | 44.194 | 'SiO$_2$V' | 246.77 |
| 40 | 325.398 | 0.700 | 'N2VP950' | 232.49 |
| 41 | 140.866 | 60.717 | 'SiO$_2$V' | 200.93 |
| 42 | 235.724 | 2.997 | 'N2VP950' | 146.44 |
| 43 | 232.815 | 16.671 | 'SiO$_2$V' | 142.60 |
| 44 | 582.777 | 6.772 | 'N2VP950' | 127.85 |
| 45 | 375.408 | 11.293 | 'SiO$_2$V' | 100.07 |
| 46 | 687.655 | 3.099 | 'N2VP950' | 84.48 |
| 47 | 0.000 | 9.375 | 'SiO$_2$V' | 73.36 |
| 48 | 0.000 | 5.000 | 'AIRV193' | 58.93 |
| 49 | 0.000 | 0.000 | | 28.04 |

Aspherical surfaces

Surface 2

K: 0.000000   KC: 100
A: 0.218716E−06   B: −.248776E−10   C: 0.185358E−14
D: −.161759E−18   E: 0.192307E−23   F: 0.547379E−28
G: 0.000000E+00   H: 0.000000E+00   J: 0.000000E+00

Surface 4

K: 0.000000   KC: 100
A: 0.290942E−07   B: 0.126121E−10   C: −.105557E−14
D: 0.362305E−19   E: 0.842431E−23   F: −.416292E−27
G: 0.000000E+00   H: 0.000000E+00   J: 0.000000E+00

Surface 8

K: 0.000000   KC: 100
A: −.150691E−08   B: 0.212074E−12   C: 0.518282E−17
D: 0.216329E−22   E: −.516324E−26   F: 0.333908E−31
G: 0.000000E+00   H: 0.000000E+00   J: 0.000000E+00

Surface 17

K: 0.000000   KC: 100
A: −.377475E−07   B: 0.114027E−11   C: 0.292881E−16
D: −.547743E−20   E: 0.158504E−24   F: 0.734629E−29
G: 0.000000E+00   H: 0.000000E+00   J: 0.000000E+00

TABLE 3-continued

Surface 21

K: 0.000000   KC: 100
A: −.113618E−08   B: −.309117E−11   C: −.571100E−15
D: 0.250974E−19   E: 0.271018E−23   F: −.232236E−27
G: 0.000000E+00   H: 0.000000E+00   J: 0.000000E+00

Surface 24

K: 0.000000   KC: 100
A: −.626858E−07   B: 0.319357E−11   C: −.159658E−15
D: 0.992952E−20   E: −.419849E−24   F: 0.152526E−28
G: 0.000000E+00   H: 0.000000E+00   J: 0.000000E+00

Surface 31

K: 0.000000   KC: 100
A: 0.459357E−08   B: −.505347E−13   C: 0.210154E−17
D: −.360092E−22   E: 0.512127E−27   F: −.669880E−32
G: 0.000000E+00   H: 0.000000E+00   J: 0.000000E+00

Surface 38

K: 0.000000   KC: 100
A: 0.667497E−09   B: 0.231564E−12   C: −.696885E−17
D: 0.193993E−21   E: 0.451888E−27   F: −.167538E−31
G: 0.000000E+00   H: 0.000000E+00   J: 0.000000E+00

Surface 40

K: 0.000000   KC: 100
A: 0.184307E−08   B: 0.428901E−12   C: 0.159451E−16
D: −.141858E−20   E: 0.396624E−25   F: −.208535E−30
G: 0.000000E+00   H: 0.000000E+00   J: 0.000000E+00

Surface 42

K: 0.000000   KC: 100
A: 0.131959E−07   B: 0.540208E−11   C: −.186730E−15
D: −.295225E−21   E: 0.112720E−23   F: −.134832E−27
G: 0.000000E+00   H: 0.000000E+00   J: 0.000000E+00

TABLE 4

| | |
|---|---|
| NA | 0.95 |
| E [mm] | 26.638 |
| $\phi_m$ [mm$^{-1}$] | 2.23e−3 |
| $\phi_m \cdot E$ | 0.059 |
| $\delta m$ in ° | 12.32 |
| $\sin(\delta m) \cdot E$ [mm] | 5.68 |
| $G_D$ [mm] | 746.2 |
| $G_D/E$ | 28 |
| dc/ds max in m$^{-2}$ | 502 |

As can be seen from Tables 3 and 4, a first, second, third and fourth aspect of the invention are realised in the second embodiment.

While the invention has been described also with respect to certain specific embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. A projection optical system for imaging a first object into a region of a second object using light of a wavelength shorter than 250 nm, the projection optical system comprising:
   a plurality of lenses disposed along an optical axis of the projection optical system;
   wherein the plurality of lenses is dividable into four non-overlapping groups of lenses, such that
   a total refractive power of a first group disposed closest to the first object is a negative refractive power, a total refractive power of a second group disposed directly adjacent to the first group is a positive refractive power,
a total refractive power of a third group disposed directly adjacent to the second group is a negative refractive power, and
a total refractive power of a fourth group disposed directly adjacent to the third group is a positive refractive power;
and wherein the following relation is fulfilled:

$$2 \cdot y \cdot NA \cdot \frac{1}{k} \cdot \sum_{i=1}^{k} |\varphi_i| \geq V_1$$

wherein:
y is half a diameter in mm of a maximum image field imaged by the projection optical system,
NA is a maximum numerical aperture on a side of the second object,
$\phi_i$ is a refractive power in $mm^{-1}$ of the $i^{th}$ lens,
k is a total number of lenses of the projection optical system,
and wherein $V_1$ is greater than 0.045.

2. The projection optical system according to claim 1, wherein $V_1$ is greater than 0.055.

3. The projection optical system according to claim 1, wherein the following relation is fulfilled:

$$2 \cdot y \cdot NA \cdot \sin\left(\frac{1}{k} \cdot \sum_{i=1}^{k} |\delta_{i1}| + |\delta_{i2}|\right) \geq V_2$$

wherein:
y is half a diameter in mm of a maximum image field imaged by the projection optical system,
NA is a maximum numerical aperture on a side of the second object,
$\delta_{i1}$ is a maximum deflection angle of imaging beams at a first optical surface of the $i^{th}$ lens,
$\delta_{i2}$ is a maximum deflection angle of imaging beams at a second optical surface of the $i^{th}$ lens,
k is a total number of lenses of the projection optical system,
and wherein $V_2$ is greater than 4.

4. The projection optical system according to claim 3, wherein $V_2$ is greater than 5.

5. The projection optical system according to claim 1, wherein each of at least five lenses of the plurality of lenses has at least one aspherical surface.

6. The projection optical system according to claim 5, wherein an axial distance between the aspherical surface and a corresponding ideal spherical shape is more than about 300 μm and less than about 500 μm,
wherein the ideal spherical shape is chosen such that a center and a periphery of the aspherical surface are positioned on the ideal spherical shape.

7. The projection optical system according to claim 5, further comprising an aperture stop disposed between two lenses of the fourth group of lenses,
wherein the fourth group of lenses consists of a first sub-group of lenses in between the first object and the aperture stop and a second sub-group of lenses in between the aperture stop and the second object.

8. The projection optical system according to claim 7, wherein the following condition is fulfilled:

$$\frac{f_1}{f_2} < 0.9 \cdot |\beta|$$

wherein
$f_1$ is a focal length of a lens unit consisting of the first, second and third group as well as the first sub-group of the fourth group,
$f_2$ is a focal length of the second subgroup of the fourth group,
$\beta$ is a magnification of the projection optical system.

9. The projection optical system according to claim 7, wherein the following condition is fulfilled:

$$\frac{f_1}{f_2} > 1.1 \cdot |\beta|$$

wherein
$f_1$ is a focal length of a lens unit consisting of the first, second and third group as well as the first sub-group of the fourth group,
$f_2$ is a focal length of the second sub-group of the fourth group,
$\beta$ is a magnification of the projection optical system.

10. The projection optical system according to claim 1, wherein the following condition is fulfilled:

$$\frac{L_D \cdot D_{beam} \cdot \log\left(\frac{1}{NA}\right)}{100 \cdot FD} < 3$$

wherein
$L_D$ is a design-distance between the first object and the second object,
$D_{beam}$ is a maximum diameter of the beam bundle
NA is a maximum numerical aperture on a side of the second object, and
FD is a maximum field-height of the first object.

11. The projection optical system according to claim 7, wherein a radial surface profile of the aspherical surface has at most one point of inflection of curvature.

12. The projection optical system according to claim 11, wherein a radial surface profile of at most one aspherical surface has a point of inflection of curvature in an optically effective area of the aspherical surface.

13. The projection optical system according to claim 1, wherein a focal length of the projection optical system is shorter than 250 mm.

14. The projection optical system according to claim 7, wherein at least one lens in the second sub-group of the fourth group of lenses is a lens of positive refractive power and wherein the at least one lens fulfils the following conditions:

$$i_1 \cdot (u_{1i} + u_{1o}) + i_2 \cdot (u_{2i} + u_{2o}) > 2.5 \text{ and } f_{4p} < 2500 \text{ mm}$$

wherein
$i_1$ is a maximum angle of incidence of an imaging beam on a first surface of the at least one lens,
$i_2$ is a maximum angle of incidence of the imaging beam on a second surface of the at least one lens,
$u_{1i}$ is a maximum angle formed between the imaging beam and the optical axis at the first surface outside of the at least one lens, $u_{2i}$ is a maximum angle formed between the imaging beam and the optical axis at the second surface inside of the at least one lens, $u_{1o}$ is a maximum angle formed between the imaging beam and the optical axis at the first surface inside of the at least one lens, $u_{2o}$ is a maximum angle formed between the imaging beam and the optical axis at the second surface outside of the at least one lens, and $f_{4p}$ focal length of the at least one lens.

15. The projection optical system according to claim 1, wherein the first group of lenses is comprised only of lenses having negative refractive power, wherein one of the lenses of the first group is a meniscus lens having a concave surface facing the first object.

16. The projection optical system according to claim 1, wherein the second group of lenses is comprised only of lenses having positive refractive power, wherein at least one of the lenses of the second group has a concave, aspherical surface.

17. The projection optical system according to claim 1, wherein the second group of lenses comprises at least three lenses.

18. The projection optical system according to claim 1, wherein at least one lens of the third group of lenses has an aspherical surface.

19. The projection optical system according to claim 1, wherein the third group of lenses is comprised only of lenses having negative refractive powers.

20. The projection optical system according to claim 19, wherein the third group of lenses comprises three or more lenses of negative refractive powers.

21. The projection optical system according to claim 1, wherein a lens having positive refractive power is disposed between two lenses having negative refractive powers in the third group of lenses.

22. The projection optical system according to claim 7, wherein the first sub-group of lenses comprises at least one lens of negative refractive power having a first and a second surface, which lens fulfils the following condition:

$$\left|\frac{c_{11} + c_{12}}{c_{11} - c_{12}}\right| < -0.5$$

wherein $c_{11}$ is a curvature of the first surface of the at least one lens and $c_{12}$ is a curvature of the second surface of the at least one lens.

23. The projection optical system according to claim 7, wherein the first sub-group of lenses comprises 2 to 4 lenses of positive refractive powers.

24. The projection optical system according to claim 7, wherein the first sub-group of lenses comprises at least one lens of negative refractive power having a first and a second surface, which lens fulfils the following condition:

$$\left|\frac{c_{21} + c_{22}}{c_{21} - c_{22}}\right| > 0.5$$

wherein $c_{21}$ is a curvature of the first surface of the at least one lens and $c_{22}$ is a curvature of the second surface of the at least one lens.

25. The projection optical system according to claim 7, wherein the second sub-group of lenses comprises only one lens having negative refractive power.

26. The projection optical system according to claim 7, wherein the second sub-group of lenses comprises a lens having negative refractive power disposed adjacent to a lens having positive refractive power, with the lens having positive refractive power being positioned closer to the second object, and wherein the negative lens fulfils the following condition:

$$\left|\frac{c_{31} + c_{32}}{c_{31} - c_{32}}\right| < -0.5$$

wherein $C_{31}$ is a curvature of the first surface of the at least one lens and $C_{32}$ is a curvature of the second surface of the at least one lens.

27. The projection optical system according to claim 7, wherein the second sub-group of lenses comprises a lens having positive refractive power disposed adjacent to a lens having negative refractive power, with the lens having negative refractive power being positioned closer to the second object, and wherein the negative lens fulfils the following condition:

$$\left|\frac{c_{41} + c_{42}}{c_{41} - c_{42}}\right| > 0.5$$

wherein $c_{41}$ is a curvature of the first surface of the at least one lens and $c_{42}$ is a curvature of the second surface of the at least one lens.

28. The projection optical system according to claim 7, wherein the second sub-group of lenses comprises no less than two and no more than four positive meniscus lenses having their concave surfaces facing the second object.

29. The projection optical system according to claim 7, wherein the first group of lenses contains a maximum of 2 aspherical lenses, the second group of lenses contains a maximum of 2 aspherical lenses, the third group of lenses contains a maximum of 1 aspherical lens, the first sub-group of the fourth group of lenses contains a maximum of 3 aspherical lenses, and the second sub-group of the fourth group of lenses contains a maximum of 3 aspherical lenses.

30. The projection optical system according to claim 7, wherein in the second sub-group of the fourth group of lenses, any lens having an aspherical surface has the aspherical surface on a side of the lens facing the second object.

31. The projection optical system according to claim 7, wherein in the first group of lenses, any lens having an aspherical surface has the aspherical surface on a side of the lens facing the first object.

32. The projection optical system according to claim 1, wherein
the following condition is fulfilled:

$$\frac{L_D}{G_D} > 1.4$$

wherein
$G_D$ is a sum of axial thicknesses of all the lenses, wherein the axial thickness of each lens represents a thickness of the lens at a location on the optical axis,
$L_D$ is a design-distance between the first object and the second object.

33. The projection optical system according to claim 1, wherein all lenses are made of calcium fluoride.

34. The projection optical system according to claim 1, wherein all lenses are made of silica.

35. The projection optical system according to claim 1, wherein one or more crystalline materials are used as lens materials.

36. The projection optical system according to claim 35, wherein the crystalline materials comprise a fluoride material.

37. The projection optical system according to claim 36, wherein one or more of the four lenses disposed closest to the second object are made of a fluoride material, wherein a crystal orientation of the fluoride material in the one or more lenses with respect to the optical axis is the same in two or more lenses.

38. The projection optical system according to claim 35, wherein one ore more lenses of the second and/or third group of lenses is made of a fluoride material.

39. The projection optical system according to claim 35, wherein one of the positive lenses in the fourth group of lenses is made of a fluoride material.

40. The projection optical system according to claim 1, wherein the projection optical system further comprises an adjustable aperture stop, wherein an axial position of an aperture formed by the aperture stop varies with the size of the aperture, wherein the axial position of the aperture is defined by an intersection of a plane defined by the aperture and the optical axis.

41. The projection optical system according to claim 40, wherein the adjustable aperture stop comprises lamellae having an essentially planar shape.

42. The projection optical system according to claim 40, wherein the adjustable aperture stop comprises lamellae essentially all of which have an identical spherical shape.

43. The projection optical system according to claim 1, wherein a numerical aperture of the projection optical system on a side of the second object is greater than 0.91.

44. The projection optical system according to claim 1, wherein the fourth lens group comprises at least one pair of directly adjacent lenses, wherein a first lens of the pair of lenses has a first and a second surface and a second lens of the pair of lenses has a third surface and a fourth surface, and wherein the first, second, third and fourth surfaces are disposed along the optical axis in this order, and wherein the following conditions are fulfilled:

$$d < V_5$$
$$\left|\frac{c_{51} + c_{52}}{c_{51} - c_{52}}\right| > V_6$$
$$c_{51} > V_7$$

wherein
d is a maximum distance between the second surface and the third surface,
$c_{51}$ is a curvature of the first surface,
$c_{52}$ is a curvature of the fourth surface, and
$V_5=15$ mm, $V_6=10$, $V_7=0.003$ mm$^{-1}$.

45. A projection optical system for imaging a first object into a region of a second object using light of a wavelength shorter than 250 nm, the projection optical system comprising:
a plurality of lenses disposed along an optical axis of the projection optical system;
wherein the plurality of lenses is dividable into four non-overlapping groups of lenses, such that
a total refractive power of a first group disposed closest to the first object is a negative refractive power,
a total refractive power of a second group disposed directly adjacent to the first group is a positive refractive power,
a total refractive power of a third group disposed directly adjacent to the second group is a negative refractive power, and
a total refractive power of a fourth group disposed directly adjacent to the third group is a positive refractive power;
and wherein the following relation is fulfilled:

$$2 \cdot y \cdot NA \cdot \sin\left(\frac{1}{k} \cdot \sum_{i=1}^{k} |\delta_{i1}| + |\delta_{i2}|\right) \geq V_2$$

wherein:
y is half a diameter in mm of a maximum image field imaged by the projection optical system,
NA is a maximum numerical aperture on a side of the second object,
$\delta_{i1}$ is a maximum deflection angle of imaging beams at a first optical surface of the $i^{th}$ lens,
$\delta_{i2}$ is a maximum deflection angle of imaging beams at a second optical surface of the $i^{th}$ lens,
k is a total number of lenses of the projection optical system,
and wherein $V_2$ is greater than 4.

46. The projection optical system according to claim 3, wherein $V_2$ is greater than 5.

47. A projection optical system for imaging a first object into a region of a second object using light of a wavelength shorter than 250 nm, the projection optical system comprising:
a plurality of lenses disposed along an optical axis of the projection optical system;
wherein the plurality of lenses is dividable into four non-overlapping groups of lenses, such that
a total refractive power of a first group disposed closest to the first object is a negative refractive power, a total refractive power of a second group disposed directly adjacent to the first group is a positive refractive power, a total refractive power of a third group disposed directly adjacent to the second group is a negative refractive power, and a total refractive power of a fourth group disposed directly adjacent to the third group is a positive refractive power;

wherein each of at least five lenses of the plurality of lenses has at least one aspherical surface, wherein an axial distance between the aspherical surface and a corresponding ideal spherical shape is more than about 300 μm and less than about 500 μm, wherein the ideal spherical shape is chosen such that a centre and a periphery of the aspherical surface are positioned on the ideal spherical shape.

48. The projection optical system according to claim 45, wherein each of the at least five aspherical surfaces having an effective diameter $D_{as}$ has a centre of curvature of the corresponding ideal spherical shape disposed on a side of the aspherical surface facing away from the lens carrying the aspherical surface, and wherein $D_{as}$ is 0.2 times a design-distance $L_D$ between the first object and the second object.

49. The projection optical system according to claim 45, wherein an absolute value of a maximum change of curvature of the aspherical surface is greater than 300 m$^{-2}$.

50. A projection optical system for imaging a first object into a region of a second object using light of a wavelength shorter than 250 nm, the projection optical system comprising:

a plurality of lenses disposed along an optical axis of the projection optical system;

wherein the plurality of lenses is dividable into four non-overlapping groups of lenses, such that a total refractive power of a first group disposed closest to the first object is a negative refractive power, a total refractive power of a second group disposed directly adjacent to the first group is a positive refractive power, a total refractive power of a third group disposed directly adjacent to the second group is a negative refractive power, and a total refractive power of a fourth group disposed directly adjacent to the third group is a positive refractive power; and wherein the following relation is fulfilled:

$$\frac{G_D}{2 \cdot y \cdot NA} \leq V_4$$

wherein:

y is half a diameter in mm of a maximum image field imaged by the projection optical system, NA is a maximum numerical aperture on a side of the second object, $G_D$ is a sum of all axial thickness of the lenses, wherein the axial thickness of each lens represents a thickness of the lens at a location on the optical axis, and wherein $V_4$ is smaller than 40.

51. The projection optical system according to claim 50, wherein $V_4$ is smaller than 35.

52. A projection exposure system, comprising:

an illumination optical system for generating a light beam of light having a wavelength shorter than 250 nm;

a mount for mounting a patterning structure as a first object;

a substrate mount for mounting a radiation sensitive substrate as a second object; and the projection optical system according to claim 1, for imaging the first object into a region of the second object.

53. A method of manufacturing a microstructured device, comprising:

using a projection exposure system, comprising:

an illumination optical system for generating a light beam of light having a wavelength shorter than 250 nm;

a mount for mounting a patterning structure as a first object;

a substrate mount for mounting a radiation sensitive substrate as a second object; and the projection optical system according to claim 1, for imaging the first object into a region of the second object; and imaging the patterning structure onto the radiation sensitive substrate with the light beam of the light having the wavelength shorter than 250 nm.

54. A microstructured device manufactured by a method, the method comprising:

using a projection exposure system, comprising:

an illumination optical system for generating a light beam of light having a wavelength shorter than 250 nm;

a mount for mounting a patterning structure as a first object;

a substrate mount for mounting a radiation sensitive substrate as a second object; and the projection optical system according to claim 1, for imaging the first object into a region of the second object; and imaging the patterning structure onto the radiation sensitive substrate with the light beam of the light having the wavelength shorter than 250 nm.

\* \* \* \* \*